United States Patent
Zhang et al.

(10) Patent No.: US 9,570,560 B2
(45) Date of Patent: Feb. 14, 2017

(54) DIFFUSED JUNCTION TERMINATION STRUCTURES FOR SILICON CARBIDE DEVICES

(71) Applicants: Cree, Inc., Durham, NC (US); The University of South Carolina, Columbia, SC (US)

(72) Inventors: Qingchun Zhang, Cary, NC (US); Anant K. Agarwal, Chapel Hill, NC (US); Tangali S. Sudarshan, Columbia, SC (US); Alexander Bolotnikov, Niskayuna, NY (US)

(73) Assignees: Cree, Inc., Durham, NC (US); The University of South Carolina, Columbia, SC (US)

( * ) Notice: Subject to any disclaimer, the term of this patent is extended or adjusted under 35 U.S.C. 154(b) by 0 days.

(21) Appl. No.: 14/102,904

(22) Filed: Dec. 11, 2013

(65) Prior Publication Data

US 2014/0097450 A1    Apr. 10, 2014

Related U.S. Application Data

(62) Division of application No. 12/719,497, filed on Mar. 8, 2010, now Pat. No. 8,637,386.

(Continued)

(51) Int. Cl.
*H01L 29/16* (2006.01)
*H01L 21/04* (2006.01)
(Continued)

(52) U.S. Cl.
CPC ....... *H01L 29/1608* (2013.01); *H01L 21/0465* (2013.01); *H01L 21/223* (2013.01);
(Continued)

(58) Field of Classification Search
CPC .............. H01L 29/1608; H01L 29/872; H01L 21/02378; H01L 29/36; H01L 29/0615; H01L 29/8613; H01L 29/0657
(Continued)

(56) References Cited

U.S. PATENT DOCUMENTS 4,242,690 A    12/1980    Temple
4,927,772 A    5/1990    Arthur et al.
(Continued)

FOREIGN PATENT DOCUMENTS

CN    1941366 A    4/2007
DE    10 2004 045 768 A1    4/2006
(Continued)

OTHER PUBLICATIONS

"Gate Recessed (GR) MOSFET with Selectively Halo-Doped Channel and Deep Graded Source/Drain for Deep Submicron CMOS", 1993 IEEE.*
(Continued)

*Primary Examiner* — Bilkis Jahan
*Assistant Examiner* — Nga Doan
(74) *Attorney, Agent, or Firm* — Myers Bigel, P.A.

(57) ABSTRACT

An electronic device includes a silicon carbide layer having a first conductivity type and a main junction adjacent a surface of the silicon carbide layer, and a junction termination region at the surface of the silicon carbide layer adjacent the main junction. Charge in the junction termination region decreases with lateral distance from the main junction, and a maximum charge in the junction termination region may be less than about $2 \times 10^{14}$ cm$^{-2}$.

15 Claims, 7 Drawing Sheets

Related U.S. Application Data

(60) Provisional application No. 61/177,372, filed on May 12, 2009.

(51) Int. Cl.
  *H01L 21/223* (2006.01)
  *H01L 29/06* (2006.01)
  *H01L 29/861* (2006.01)
  *H01L 29/36* (2006.01)
  *H01L 29/872* (2006.01)

(52) U.S. Cl.
  CPC ...... *H01L 29/0615* (2013.01); *H01L 29/0657* (2013.01); *H01L 29/0661* (2013.01); *H01L 29/36* (2013.01); *H01L 29/8613* (2013.01); *H01L 29/872* (2013.01)

(58) Field of Classification Search
  USPC .......................................................... 257/77
  See application file for complete search history.

(56) References Cited

U.S. PATENT DOCUMENTS

| | | | |
|---|---|---|---|
| 5,250,448 A | 10/1993 | Hamasaki et al. | |
| 5,726,469 A | 3/1998 | Chen | |
| 5,804,483 A | 9/1998 | Harris | |
| 5,914,500 A | 6/1999 | Bakowski et al. | |
| 5,932,894 A * | 8/1999 | Bakowski | H01L 29/0619 257/655 |
| 5,967,795 A | 10/1999 | Bakowsky et al. | |
| 5,977,605 A * | 11/1999 | Bakowsky | H01L 29/0615 257/493 |
| 6,083,814 A | 7/2000 | Nilsson | |
| 6,696,705 B1 | 2/2004 | Barthelmess et al. | |
| 6,696,728 B2 | 2/2004 | Onishi et al. | |
| 7,026,650 B2 | 4/2006 | Ryu et al. | |
| 7,144,797 B2 | 12/2006 | Chow et al. | |
| 7,186,323 B2 | 3/2007 | Hara | |
| 7,304,363 B1 | 12/2007 | Shah | |
| 7,649,213 B2 | 1/2010 | Hatakeyama et al. | |
| 7,838,377 B2 | 11/2010 | Zhang et al. | |
| 2004/0135153 A1 | 7/2004 | Ryu et al. | |
| 2005/0205872 A1 | 9/2005 | Hallin et al. | |
| 2006/0068571 A1 * | 3/2006 | Chow | H01L 21/0465 438/514 |
| 2006/0118900 A1 | 6/2006 | Zeghbroeck | |
| 2006/0273346 A1 | 12/2006 | Pfirsch | |
| 2007/0001230 A1 | 1/2007 | Lee et al. | |
| 2007/0120148 A1 | 5/2007 | Nogome | |
| 2007/0241427 A1 | 10/2007 | Mochizuki et al. | |
| 2008/0001158 A1 | 1/2008 | Das et al. | |
| 2008/0006848 A1 | 1/2008 | Chen et al. | |
| 2008/0105949 A1 | 5/2008 | Zhang et al. ................. 257/584 |
| 2009/0045413 A1 | 2/2009 | Ishii et al. | |
| 2009/0212301 A1 | 8/2009 | Zhang et al. | |
| 2010/0032685 A1 * | 2/2010 | Zhang et al. .................... 257/77 |
| 2010/0289032 A1 | 11/2010 | Zhang et al. | |

FOREIGN PATENT DOCUMENTS

| | | |
|---|---|---|
| EP | 0 176 778 A2 | 4/1986 |
| EP | 0 389 863 A1 | 10/1990 |
| EP | 1 806 787 A1 | 7/2007 |
| JP | 66-006887 A | 1/1980 |
| JP | 02-294026 | 12/1990 |
| JP | H02-294026 A | 12/1990 |
| JP | 03-094469 | 4/1991 |
| JP | 3-225870 | 10/1991 |
| JP | 4-092434 A | 3/1992 |
| JP | H10167126 A | 6/1998 |
| JP | 3-068838 B2 | 7/2000 |
| JP | 2000-516767 A | 12/2000 |
| JP | 2001-035857 A | 2/2001 |
| JP | 2001-196604 A | 7/2001 |
| JP | 2002-516027 A | 5/2002 |
| JP | 2006-100593 A | 4/2006 |
| JP | 2006-196652 A | 7/2006 |
| JP | 2006-516815 A | 7/2006 |
| JP | 2007-096006 A | 4/2007 |
| JP | 2007-115875 A | 5/2007 |
| JP | 2007-165604 A | 6/2007 |
| JP | 2007-173841 A | 7/2007 |
| JP | 4092434 B1 | 5/2008 |
| JP | 2009-044177 A | 2/2009 |
| JP | 2009-164486 A | 7/2009 |
| WO | WO 96/03774 | 2/1996 |
| WO | WO 97/08754 | 3/1997 |
| WO | WO 97/08754 A2 | 3/1997 |
| WO | WO 98/02924 A2 | 1/1998 |
| WO | WO 98/32178 A1 | 7/1998 |
| WO | WO 2006/135031 A2 | 12/2006 |
| WO | WO 2006/135031 A3 | 12/2006 |
| WO | WO 2007/040710 A1 | 4/2007 |

OTHER PUBLICATIONS

"Realizing High Breakdown Voltage for a Novel Interface Charges Island Structure Based on Partial-SOI Sbustrate", Microelectronics Reliability 52 (2012) 692-697.*

Japanese Office Action Corresponding to Japanese Patent Application No. 2013-553461; Dispatched Date: Sep. 29, 2014; Foreign Text, 2 Pages, English Translation Thereof, 2 Pages.

Korean Office Action Corresponding to Korean Patent Application No. 10-2010-7021354; Foreign Text, 6 Pages, English Translation Thereof, 4 Pages.

Taiwanese Office Action Corresponding to Taiwanese Patent Application No. 101104463; Issuance Date: Dec. 27, 2014; Foreign Text, 7 Pages, English Translation Thereof, 5 Pages.

Translation of Chinese 1$^{st}$ Office Action, CN Patent Application No. 201080032441, Mar. 9, 2010; 13 pg.

Translation of Preliminary Rejection (4 pages), non-English Preliminary Rejection (1 page), Korean Patent Application No. 10-2010-7010197, mailed Jul. 2, 2014.

Notification of Transmittal of the International Search Report and the Written Opinion of the International Searching Authority, or the Declaration; International Search Report; Written Opinion of the International Searching Authority—Corresponding to International Application No. PCT/US2010/026632; Date of Mailing: Oct. 8, 2010; 16 pages.

Losee et al., "High Voltage 4H-SiC PIN rectifiers with single-implant, multi-zone JTE termination", Power Semiconductor Devices and ICS, 2004; Proceedings ISPSD 2004; The 16$^{th}$ International Symposium on Kitakyushu Int. Conf. Ctr. Japan, May 24-27, 2004; Piscataway, NJ, USA, IEEE, May 24, 2004, pp. 301-304, XP010723398.

Vassilevski et al,, "High Voltage Silicon Carbide Schottky. Diodes with Single Zone Junction Termination Extension", Materials Science Forum, 2007 Trans Tech Publications, vols. 556-557 (2007) pp. 873-876, XP8124186.

Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.

Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.

Asano et al., "Dynamic Characteristics of 6.2kV High Voltage 4H-SIC pn Diode with Low Loss", Transactions of the Institute of Electrical Engineers of Japan, Part D Inst. Electr. Eng. Japan, vol. 123D, No. 5, May 2003, pp. 623-627, XP8124184.

Sundaresan et al., "Ultra-low resistivity Al+ Implanted 4H-SiC obtained by microwave annealing and a protective graphite cap", *Solid-State Electronics* vol. 52, 2008, pp. 140-145, XP022360431.

European Search Report for corresponding EP patent application No. 09163424.6 dated Apr. 9, 2010.

International Search Report and Written Opinion (13 pages) corresponding to International Application No. PCT/US2008/010538; Mailing Date: Dec. 22, 2008.

(56) References Cited

OTHER PUBLICATIONS

International Search Report and Written Opinion, International Application No. PCT/US2009/000734, Apr. 23, 2009.
Kinoshita et al., "Guard Ring Assisted RESURF: A Now Termination Structure Providing Stable and High Breakdown Voltage for SiC Power Devices," Tech. Digest of ISPSD '02, pp. 253-256.
Singh, R. and J.W. Palmour, "Planer Terminations in 4H-SiC Schottky Diodes with Low Leakage and High Yields," IEEE International Symposium on Power Semiconductor Devices and ICs, 1997, pp. 157-160.
Ueno et al., "The Guard-Ring Termination for the High-Voltage SiC Schottky Barrier Diodes". *IEEE Electron Device Letters*. vol. 16, No. 7, Jul. 1995, pp. 331-332.
Yilmaz, "Optimization and Surface Charge Sensitivity of High Voltage Blocking Structures with Shallow Junctions," IEEE Transactions on Electron Devices, vol. 38, No. 3, Jul. 1991, pp. 1666-1675.
International Preliminary Report on Patentability Corresponding to International Application No. PCT/US2010/026632; Date of Mailing: Jun. 10, 2011; 15 Pages.
Gao Y. et al., "Investigation of boron diffusion in 6H-SiC", *Applied Physics Letters*, vol. 83, No, 5, Aug. 4, 2003, pp. 905-907.
Gao, Y. et al "Selective doping of 4H-SiC by codiffusion of aluminum and boron", *Journal of Applied Physics*, vol. 90, No. 11, Dec. 1, 2001, pp. 5647-5651.
Grekhov, I.V. et al., "High-Voltage (900 V) 4H-SiC Schottky Diodes with a Boron-Implanted guard p-n Junction", *Semiconductors*, vol. 42, No. 2, 2008, pp. 211-214.
Merrett, J.N. et al., "Fabrication of Self-Aligned Graded Junction Termination Extensions with Applications to 4H-SiC P-N Diodes", *Journal of Electronic Materials*, vol. 31, No. 6, 2002, pp. 635-639.
Solmi, S. et al., "High-concentration boron diffusion in silicon: Simulation of the precipitation phenomena", *Journal of Applied Physics*, vol. 68, No. 7, Oct. 1, 1990, pp. 3250-3258.
Soloviev, S. I. et al., "Doping of 6H-SiC by selective diffusion of boron", *Applied Physics Letters*, vol. 77, No. 24, Dec. 11, 2000, pp. 4004-4006.
Japanese Office Action Corresponding to Japanese Patent Application No. 2009-186765; Mailing Date: May 8, 2012; Foreign Text, 2 Pages, English Translation Thereof, 2 Pages.
International Search Report Corresponding to International Application No. PCT/US2012/023263; Date of Mailing: Aug. 6, 2012; 15 Pages.
Japanese Office Action Corresponding to Japanese Patent Application No. 2010-533058; Mailing Date: Nov. 9, 2012; Foreign Text, 3 Pages, English Translation Thereof, 4 Pages.
European Search Report Corresponding to European Patent Application No. 08 846 287; Dated: Jun. 20, 2013; 4 Pages.
International Preliminary Report on Patentability Corresponding to International Application No. PCT/US2012/023263; Date of Mailing: Aug. 22, 2013; 9 Pages.
Notification of Reasons for Rejection, JP 2012-510804, Nov. 5, 2013, 10 pages.
Korean Notice of Preliminary Rejection Corresponding to Korean Patent Application No. 10-2011-7028952; Mailing Date: Nov. 4, 2015; Foreign Text, 10 Pages, English Translation Thereof, 9 Pages.

\* cited by examiner

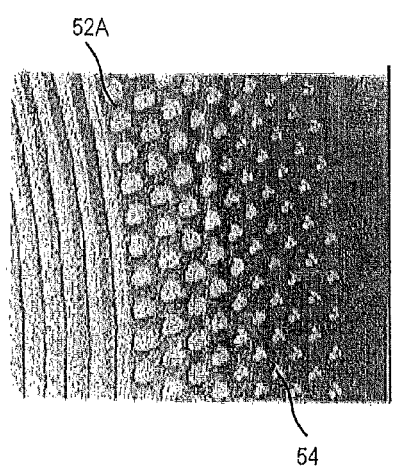
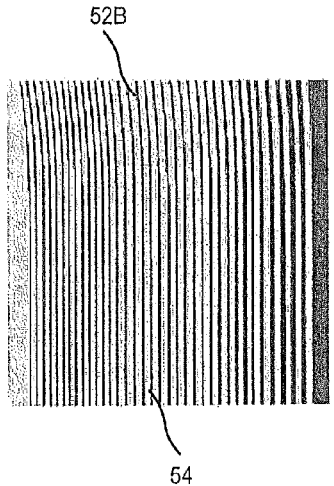
FIGURE 7A  FIGURE 7B
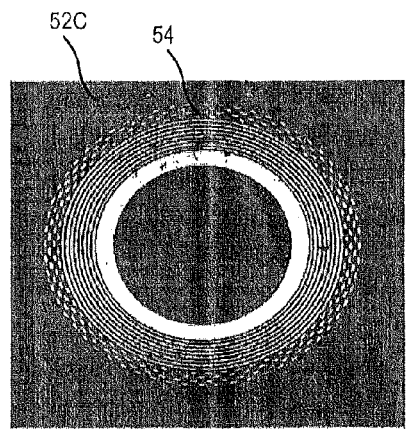
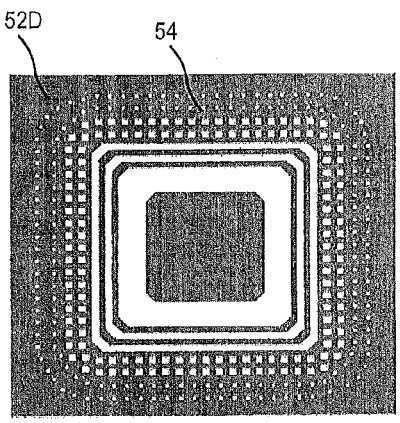
FIGURE 7C  FIGURE 7D

DIFFUSED JUNCTION TERMINATION STRUCTURES FOR SILICON CARBIDE DEVICES

CROSS REFERENCE TO RELATED APPLICATIONS

This is a divisional application of U.S. application Ser. No. 12/719,497, filed Mar. 8, 2010, now U.S. Pat. No. 8,637,386, which claims the benefit of and priority to U.S. Provisional Patent Application No. 61/177,372, filed May 12, 2009, the disclosures of which are hereby incorporated herein by reference in their entirety.

STATEMENT OF U.S. GOVERNMENT INTEREST

This invention was made with Government support under Contract No. DAAL01-97-C-0108 awarded by Army Research Laboratories. The Government has certain rights in the invention.

FIELD

The present invention relates microelectronic devices, and more particularly to edge termination for silicon carbide devices.

BACKGROUND

High voltage silicon carbide (SiC) devices can be capable of handling high voltages, and may handle as much as about 100 amps or more of current, depending on the size of their active area. High voltage SiC devices have a number of important applications, particularly in the field of power conditioning, distribution and control.

A conventional power device structure has an n-type SiC substrate on which an n– epitaxial layer, which functions as a drift region, is formed. The device typically includes a P-N and/or Schottky junction on the n– layer, which acts as a main junction for blocking voltage in the reverse bias direction and providing current flow in the forward bias direction. A p-type junction termination extension (JTE) region, which is typically formed by ion implantation, may surround the main junction. The implants used to form the JTE region may be aluminum, boron, or any other suitable p-type dopant. The purpose of the JTE region is to reduce or prevent the electric field crowding at the edges, and to reduce or prevent the depletion region from interacting with the surface of the device. Surface effects may cause the depletion region to spread unevenly, which may adversely affect the breakdown voltage of the device. Other termination techniques include guard rings and floating field rings that may be more strongly influenced by surface effects. A channel stop region may also be formed by implantation of n-type dopants, such as nitrogen or phosphorus, in order to prevent/reduce extension of the depletion region to the edge of the device.

Additional conventional terminations of SiC Schottky diodes are described in "Planar Terminations in 4H-SiC Schottky Diodes With Low Leakage And High Yields" by Singh et al., ISPSD '97, pp. 157-160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331-332. Additionally, other termination techniques are described in published PCT Application No. WO 97/08754 entitled "SiC Semiconductor Device Comprising A PN Junction With A Voltage Absorbing Edge."

In addition to junction termination extension (JTE), multiple floating guard rings (MFGR) and field plates (FP) are commonly used termination schemes in high voltage silicon carbide devices. Another conventional edge termination technique is a mesa edge termination.

Field plate termination is also a conventional technique for edge termination of a device and may be cost-effective. In conventional field plate devices, high fields are supported by the oxide layer under the metal field plate. This technique performs well for silicon devices where the highest field in the semiconductor is relatively low. However, in SiC devices the electric fields in the blocking state may be very high (~2 MV/cm) which multiplies by a factor of 2.5 at the oxide-semiconductor interface. This leads to very high oxide fields and may result in long-term reliability problems. Thus, field plate terminations may be unsuitable for use in SiC devices.

The use of multiple floating guard rings in addition to JTE has been proposed as a technique for reducing the sensitivity of the JTE to implant dose variation. See Kinoshita et al., "Guard Ring Assisted RESURF: A New Termination Structure Providing Stable and High Breakdown Voltage for SiC Power Devices," Tech. Digest of ISPSD '02, pp. 253-256. Kinoshita et al. reported that such techniques reduced the sensitivity to implant dose variation. However, the area utilized for termination was increased to almost three times the area of JTE alone as the guard rings are added to both the inner edge of the JTE and the outside of the JTE.

A conventional JTE-terminated PIN diode is illustrated in FIG. 1. As shown therein, a PIN diode 100 includes an n– drift layer 112 between a p+ layer 116 and an n+ substrate 114. FIG. 1 illustrates one half of a PIN-structure; the structure may include mirror image portions (not shown). An anode contact 123 is on the p+ layer 116, and a cathode contact 125 is on the n+ substrate 114. A junction termination extension (JTE) region 120 including a plurality of JTE zones 120A, 120B, 120C is provided in the n– drift layer 112 adjacent the p+ layer 116. The JTE zones 120A, 120B, 120C are p-type regions that may have levels of charge that decrease outwardly in a stepwise fashion with distance from the PN junction between the p+ layer 116 and the n– drift layer 112. Although three JTE zones 120A, 120B, 120C are illustrated, more or fewer JTE zones may be provided.

The JTE zones 120A, 120B, 120C may be formed by successive implantation of ions into the n– drift layer 112. However, such implantation may require multiple mask and implantation steps, increasing the complexity and expense of production. This may be exacerbated as the number of JTE zones is increased. Furthermore, the stepwise doping gradient provided by such an approach may not provide an ideal termination.

SUMMARY

Some embodiments provide methods of forming a junction termination extension for an electronic device including a main junction region. The methods include forming a mask on a semiconductor layer adjacent the main junction region, the semiconductor layer having a first conductivity type and the mask including a plurality of openings. A source of second conductivity type dopants is provided at the surface of the semiconductor layer, and the second conductivity type dopants are diffused into the semiconductor layer to form doped regions in the semiconductor layer corresponding to respective ones of the mask openings that coalesce while leaving dopant peaks in the semiconductor layer corresponding to respective ones of the mask openings near the surface of the silicon carbide layer. A near-surface region of the semiconductor layer that includes the dopant peaks is removed. The semiconductor layer may include a silicon carbide layer.

The mask openings may have respective areas that expose areas of a surface of the semiconductor layer that become smaller with lateral distance from the main junction region. The doped regions may provide a diffused junction termination region in the semiconductor layer having a lateral doping gradient that decreases with distance from the main junction region.

Removing the near-surface region of the silicon carbide layer may include removing material from the silicon carbide layer including the dopant peaks.

Providing the source of second conductivity type dopants may include implanting second conductivity type dopants into the silicon carbide layer.

Providing the source of second conductivity type dopants may include providing a vapor phase diffusion source of second conductivity dopants adjacent the silicon carbide layer under conditions selected to cause second conductivity dopants in the vapor phase diffusion source to diffuse into the silicon carbide layer.

Diffusing the second conductivity type dopants may include annealing the silicon carbide layer including the second conductivity type dopants at a temperature in excess of 1800° C.

The methods may further include forming a graphite cap layer on the silicon carbide layer, annealing the silicon carbide layer may include annealing the silicon carbide layer and the graphite cap layer.

A peak concentration of second conductivity type dopants in the silicon carbide layer after removal of the non-diffused dopant peaks may be about $10^{18}$ cm$^{-3}$ or less, and in some embodiments, about $10^{17}$ cm$^{-3}$ or less.

The junction termination region may have a peak dopant concentration that varies in a lateral dimension from a high dopant concentration closest to the main junction region to a low dopant concentration farthest from the main junction region.

The junction termination region may have a peak dopant concentration that decreases smoothly in a lateral dimension.

The source of second conductivity dopants may provide a peak dopant concentration of about $10^{18}$ cm$^{-3}$ or more in the silicon carbide layer at locations corresponding to the plurality of openings.

The plurality of openings may have a lateral width Ld and a spacing between adjacent openings of Lnd, and Ld may decrease with distance from the main junction region and/or Lnd may increase with width from the main junction region. In some embodiments, Ld may vary from about 2.5 µm to about 1 µm. Furthermore, Lnd may be about 2 µm.

The mask may include a plurality of zones, including a first zone closest to the main junction region and a second zone that is farther from the main junction region from the first zone. In the first zone, the spacing Lnd between adjacent openings may remain constant with distance from the main junction region and the lateral width Ld of the openings may decrease with distance from the main junction region. In the second zone, the spacing Lnd between adjacent openings may increase with distance from the main junction region and the lateral width Ld may remain constant with distance from the main junction region.

The mask may include a third zone that is farther from the main junction than the second zone, and in the third zone, the lateral width Ld of the openings may remain constant with distance from the main junction, and the spacing Lnd between adjacent openings increases by an increasing amount with distance from the main junction region.

An electronic device according to some embodiments includes a silicon carbide layer having a first conductivity type and including a main junction adjacent a surface of the silicon carbide layer, and a junction termination region at the surface of the silicon carbide layer adjacent the main junction. The charge in the junction termination region decreases with lateral distance from the main junction, and a charge in the junction termination region may be less than about $2 \times 10^{14}$ cm$^{-2}$.

The junction termination region may have a lateral width $L_{JTE}$. In some embodiments, a maximum charge in the junction termination region may be less than about $1 \times 10^{14}$ cm$^{-2}$. A maximum doping concentration in the junction termination region may be about $5 \times 10^{18}$ cm$^{-3}$.

The electronic device may further include a semiconductor mesa at a surface of the silicon carbide layer, and the junction termination region may be adjacent the semiconductor mesa.

A charge in the junction termination region near a surface of the silicon carbide layer may decrease laterally in a smooth fashion from the maximum charge near the main junction down to about $5 \times 10^{12}$ cm$^{-2}$.

An electronic device according to further embodiments includes a silicon carbide layer having a first conductivity type and including a main junction adjacent a surface of the silicon carbide layer. A junction termination region is at a surface of the silicon carbide layer adjacent the main junction. The junction termination region includes a region of second conductivity type dopants that has a total charge of about $5 \times 10^{13}$ cm$^{-2}$ or less in a region adjacent the primary junction and may have a doping profile that decreases with distance from the main junction in an approximately linear fashion.

DESCRIPTION OF THE DRAWINGS

FIGS. 7A-7D illustrate exemplary mask layouts for forming JTE terminations according to some embodiments.

DETAILED DESCRIPTION

Figure 1:
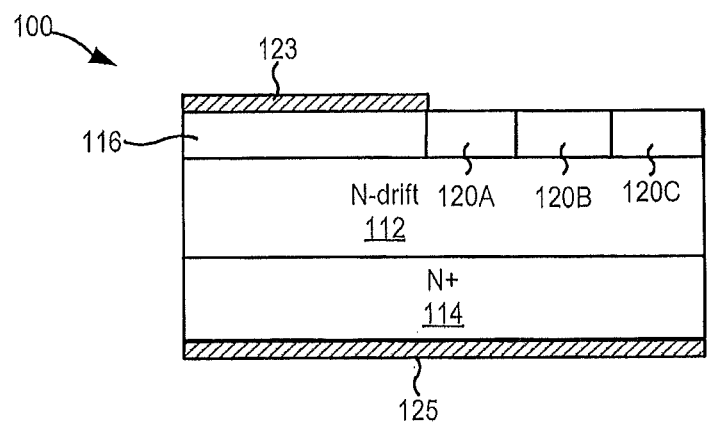
FIG. 1 illustrates a SiC PIN diodes with a conventional junction termination extension (JTE) termination.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

As is described in more detail below, embodiments of the present invention may provide improved edge termination of semiconductor devices, such as P-N, Schottky, PiN or other such semiconductor devices. Particular embodiments of the present invention provide edge termination for silicon carbide (SiC) devices. For example, embodiments of the present invention may be utilized as edge termination for SiC Schottky diodes, junction barrier Schottky (JBS) diodes, PiN diodes, thyristors, transistors, or other such SiC devices.

According to some embodiments, a junction termination extension that has a smoothly graded doping profile in both lateral and vertical directions can be provided in a silicon carbide device by controlled diffusion of dopants. As used herein, a smoothly graded doping profile refers to a doping profile that is graded in a non-stepwise fashion so that it is not characterized by having sharp changes in doping concentration. A smoothly graded doping profile may, for example, be graded in a linear, quasi-linear and/or log-linear fashion.

The dopants may be provided adjacent a main or primary junction in a silicon carbide layer by diffusion or implantation through a plurality of openings in a mask formed on the silicon carbide layer. The openings may be formed to expose portions of the silicon carbide layer that have areas that decrease with distance from the junction. The silicon carbide layer may be annealed to cause the dopants introduced through the plurality of openings to diffuse out and form a single doped JTE region within the silicon carbide layer. Stated differently, doped regions in the silicon carbide layer corresponding to the mask openings are expanded by controlled diffusion so that they coalesce to form a single junction termination region that has a doping concentration that may be smoothly graded, and in some cases linearly or nearly linearly graded in the vertical and/or lateral directions. In particular embodiments, the JTE can extend a distance $L_{JTE}$ of about 200 μm or more from a main junction area with a linearly graded doping profile that decreases laterally with distance from the main junction from about $5 \times 10^{13}$ cm$^{-2}$ near the main junction down to about $5 \times 10^{11}$ cm$^{-2}$ assuming a JTE depth of 0.5 µm. Such a device may have superior junction termination characteristics compared to a conventional implanted JTE, which may require multiple masks for implantation and may not be able to obtain a linearly graded doping profile in a lateral dimension.

Figure 2A:
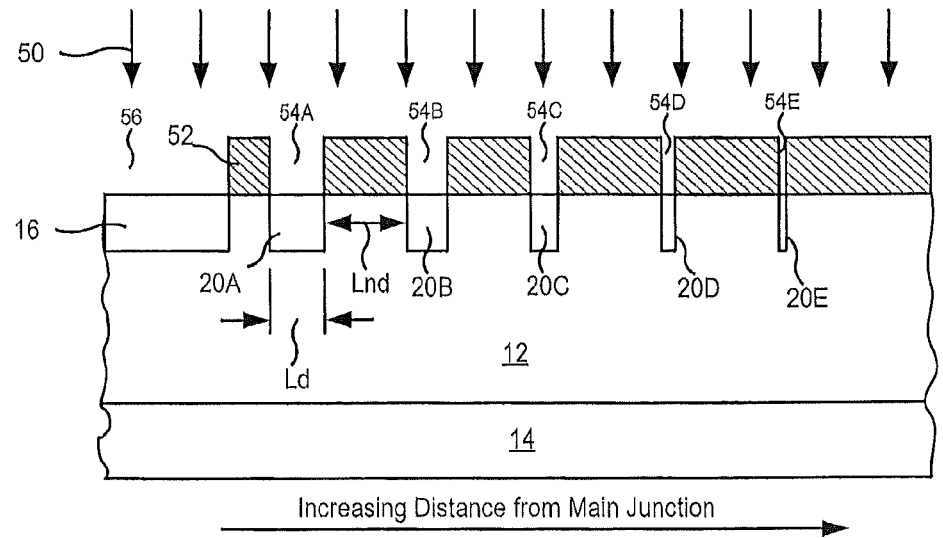
FIGS. 2A and 2B illustrate formation of a JTE termination according to some embodiments.
Figure 2B:
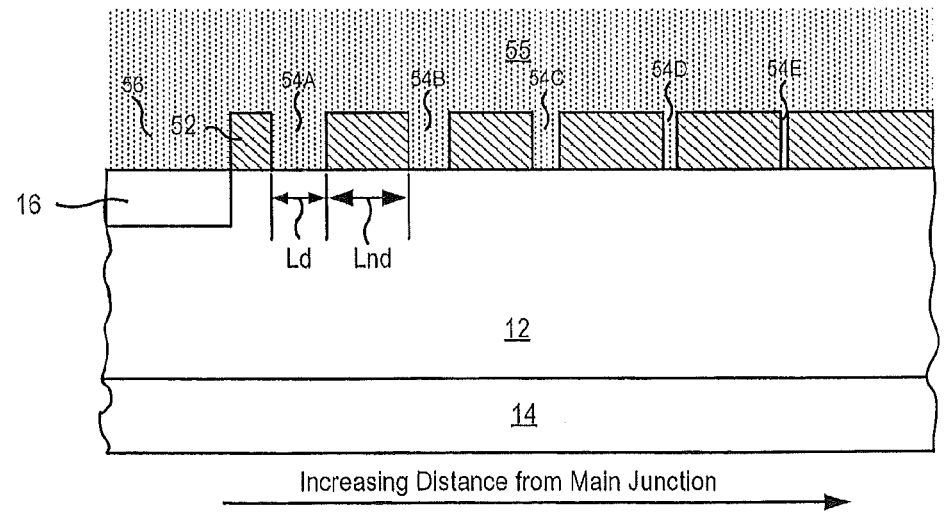

Exemplary embodiments are illustrated in FIGS. 2A and 2B. Referring to FIGS. 2A and 2B, an n– silicon carbide drift layer 12 is formed on an n+ silicon carbide substrate 14. The substrate 14 may include on- or off-axis silicon carbide of the 4H, 6H, 3C and/or 15R polytype. A graphite mask 52 including mask openings 56 and 54A to 54E is formed on a surface of the drift layer 12. The mask opening 56 corresponds to the location of a main junction of the device. For example, in a PIN device, the main junction would correspond to the PN junction through which a majority of conduction occurs in the forward operating state. It will be appreciated that in some devices, such as Schottky diodes, the main junction may include a metal-semiconductor junction instead of or in addition to a P-N junction.

The mask openings 54A to 54E are located adjacent to the main junction, and are formed to expose areas of the surface of the drift layer 12 that decrease with lateral distance from the main junction. That is, the mask openings 54A to 54E that are closer to the main junction may be wider and/or spaced closer together than mask openings 54A to 54E that are farther away from the main junction, which may be smaller and/or spaced farther apart from one another.

Each of the openings 54A to 54E has a first width Ld, and is spaced apart from an adjacent opening by a second width Lnd. As illustrated in FIGS. 2A and 2B, the first width Ld may decrease with lateral distance from the main junction, while the second width Lnd may increase with lateral distance from the main junction.

Referring to FIG. 2A, in some embodiments, p-type dopants 50 may be introduced into the drift layer 12 by ion implantation to form doped regions 20A to 20E corresponding to the mask openings 54A to 54E, respectively. The doped regions 20A to 20E may have a doping profile in the vertical direction (perpendicular to the surface of the drift layer 12) that has a box, retrograde or buried profile.

Ions may be implanted into the drift layer 12 to form doped regions 20A to 20E that have a sufficient amount of total charge to be diffused to form a desired JTE doping profile in the drift layer 12 during a subsequent thermal drive-in anneal. In some embodiments, the doped regions 20A to 20E may have a peak doping concentration prior to the drive-in anneal that is in excess of $10^{19}$ cm$^{-3}$. Exemplary implantation conditions that can be employed to obtain a desired amount of charge are shown in Table 1.

Table 1 shows an implant schedule for obtaining a box profile of aluminum ions in 4H—SiC having a peak doping concentration of about $1 \times 10^{19}$ cm$^{-3}$.

TABLE 1

Exemplary Ion Implantation Schedule

| Dose (cm$^{-2}$) | Energy (keV) |
| --- | --- |
| $2.0 \times 10^{13}$ | 40 |
| $2.8 \times 10^{13}$ | 80 |
| $4.3 \times 10^{13}$ | 150 |

As illustrated in FIG. 2B, p-type dopants may in some embodiments be introduced into the drift layer 12 by diffusion doping. Diffusion doping of silicon carbide is described, for example, in Y. Gao et al., "Selective doping of 4H—SiC by codiffusion of aluminum and boron," J. of Appl. Phys., col. 90, no. 11, pp. 5647-5651 (2001); S. I. Soloviev et al., "Doping of 6H—SiC by selective diffusion of boron," Appl. Phys. Letters, vol. 77, no. 4, pp. 4004-4006 (2000); and Y. Gao, et al., "Investigation of boron diffusion in 6H—SiC," Appl. Phys. Letters, vol. 83, no. 5, pp. 905-907 (2003).

Diffusion doping of SiC may have some advantages compared to ion implantation. In particular, diffusion doping does not introduce radiation damage to the SiC lattice. Diffusion doping also may be suitable for forming deep, linearly graded p-n junctions in SiC. Furthermore, diffused boron is able to compensate n-type doping, forming a buried intrinsic layer. However, diffusion doping of SiC requires extremely high processing temperatures, e.g., above 1800° C., which can cause the SiC substrate being doped to physically degrade. Furthermore, it is desirable to establish equilibrium conditions of SiC source materials in the crucible to avoid or discourage either sublimation or epitaxial growth during the sublimation process.

For example, in some embodiments, a silicon carbide substrate 14 including a silicon carbide drift layer 12 thereon may be exposed to a gas phase source of p-type dopants at a pressure of 500 Torr in an argon ambient at temperatures of from about 1800° C. to about 2200° C. for a time of about 5 to 30 minutes. In order to protect the surface of the drift layer 12, the mask 52 may include a graphite film on the surface of the drift layer. The diffusion process may be carried out in some embodiments using an inductively heated vertical quartz chamber with water-cooled walls.

Boron and/or aluminum vapor can be generated by sublimation from solid sources. For example, boron can be sublimated from elemental boron, while aluminum can be sublimated from $Al_4C_3$. In particular embodiments, boron atoms may be doped into the drift layer 12, and the gas phase source may include 2.5% elemental boron.

In order to sustain the equilibrium condition of the process, a graphite crucible with a mixture of silicon carbide powder and elemental boron (as a source of the doping atoms) may be used, with zero temperature gradient between the gas phase and the substrate. Once the equilibrium condition is established inside the crucible, the velocity of sublimation and epitaxial growth of SiC on the substrate 14 may be equal, and the p-type impurities will be diffused into the drift layer 12. Diffusion of the impurities into the drift layer 12 is believed to be aided by silicon vacancies in the SiC layer.

Unintentional diffusion of boron on the back side of the substrate 14 opposite the drift layer 12 can be removed by lapping the substrate with a diamond paste. Furthermore, after diffusion, the graphite mask 52 can be removed by burning in an oxygen environment.

Figure 3:
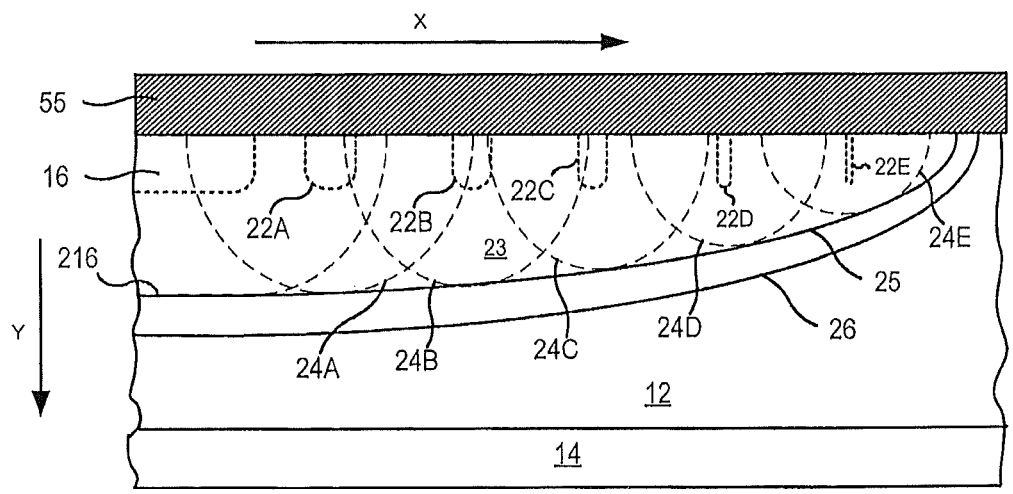
FIG. 3 illustrates a silicon carbide layer including a plurality of diffused doped regions according to some embodiments.

Following formation of the doped regions 20A to 20E through ion implantation and/or diffusion of dopants, a drive-in anneal is performed to diffuse the dopants into the drift layer 12 to form a graded JTE profile 25 that is relatively smoothly graded from a high doping concentration to a low doping concentration in both the lateral (X) and vertical (Y) directions, as illustrated in FIG. 3. In some embodiments, the doped regions 20A to 20B may be annealed at a temperature greater than 1600° C., and in some embodiments greater than 1800° C. The doped regions may be annealed for 5 minutes or more, and in some embodiments for 30 minutes or more. In particular embodiments, the doped regions 20A to 20B may be annealed at a temperature of about 1800° C. for about 30 minutes. A blanket graphite cap layer 55 may be formed on the surface of the drift layer 12 prior to the anneal to protect the surface of the drift layer 12.

During the drive-in anneal process, dopants in the doped regions 16 and 20A to 20E diffuse further into the drift layer 12. For example, dopants in the doped region 16 diffuse out to form doped region 216. Similarly, dopants in the doped region 20A diffuse out to form doped region 24A, dopants in the doped region 20B diffuse out to form doped region 24B, etc. However, even after the drive-in anneal, non-diffused dopant concentration peaks 22A-22E remain in a near-surface region of the drift layer 12. In particular, when the doped regions 20A to 20E are formed in a layer of silicon carbide or another semiconductor material in which dopants do not readily diffuse, dopant concentration peaks may remain even after the drive-in anneal.

The diffused doped regions 24A to 24E merge together to form a continuously doped JTE region 23 that has a doping concentration that may decrease smoothly with lateral distance from the main junction as well as with vertical distance from the surface of the drift layer 12. For example, curves 25 and 26 represent curves of relatively constant p-type doping concentration in the drift layer 12. The doping concentration along curve 26 is less than the doping concentration along curve 25. A PN junction is formed along the contour where the p-type doping concentration of the JTE region 23 is equal to the n-type doping concentration of the drift layer 12.

In the case of boron, the diffusion coefficient in SiC is 4 to 5 times higher in the lateral direction than in the vertical (c-axis) direction. Thus, the lateral diffusion of boron may provide a good overlap, or lateral merging, of diffused regions in the lateral direction, resulting in the formation of larger regions with smaller average doping compared to, for example, blanket diffusion of dopants. That is, in blanket diffusion of dopants (i.e., only a single JTE opening is used), the dopants may diffuse laterally by a certain distance, but the average doping may not decrease significantly as a result of this lateral diffusion. In contrast, when multiple JTE openings are used, more of the resulting JTE region is doped due to lateral diffusion of dopants, resulting in smaller average doping in the JTE region.

Figure 4A:
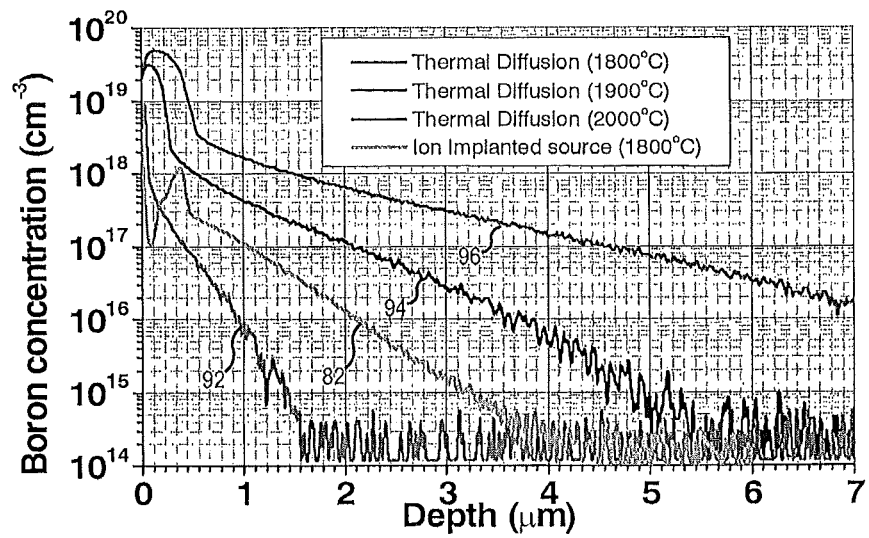
FIGS. 4A and 4B illustrate several different doping profiles of p-type dopants in 4H—SiC as measured by secondary ion mass spectrometry (SIMS).

Several different doping profiles of p-type dopants in 4H—SiC as measured by secondary ion mass spectrometry (SIMS) are illustrated in FIG. 4A. In particular, FIG. 4A illustrates four different doping profiles of boron in 4H—SiC. Details of the profiles are shown in Table 2.

TABLE 2

Exemplary Doping Conditions

| Curve | Doping Type | Anneal Temperature (° C.) |
|---|---|---|
| 82 | Implantation | 1800 |
| 92 | Diffusion | 1800 |
| 94 | Diffusion | 1900 |
| 96 | Diffusion | 2000 |

Referring to FIG. 4A, the initial charge of boron in the silicon carbide diffusion was determined by the pressure and temperature in the quartz reactor in the case of curves 92, 94, and 96. In the case of curve 82, the initial charge was provided and precisely controlled by ion implantation, and the doped silicon carbide layer was annealed at a temperature of 1800° C. for five minutes in an atmosphere of argon to redistribute and activate the dopants.

As is apparent from FIG. 4A, the dopant profile extends deeper for higher diffusion temperatures. However, the peak concentration of dopants near the surface of the silicon carbide layer remains relatively high in each case. Such a high concentration of dopants may be undesirable in a junction terminal extension, because the JTE region may not become fully depleted at the design blocking voltage. However, beyond the regions of peak concentration near the surface, the dopant concentrations in each case decrease with depth in a generally log-linear fashion.

Figure 4B:
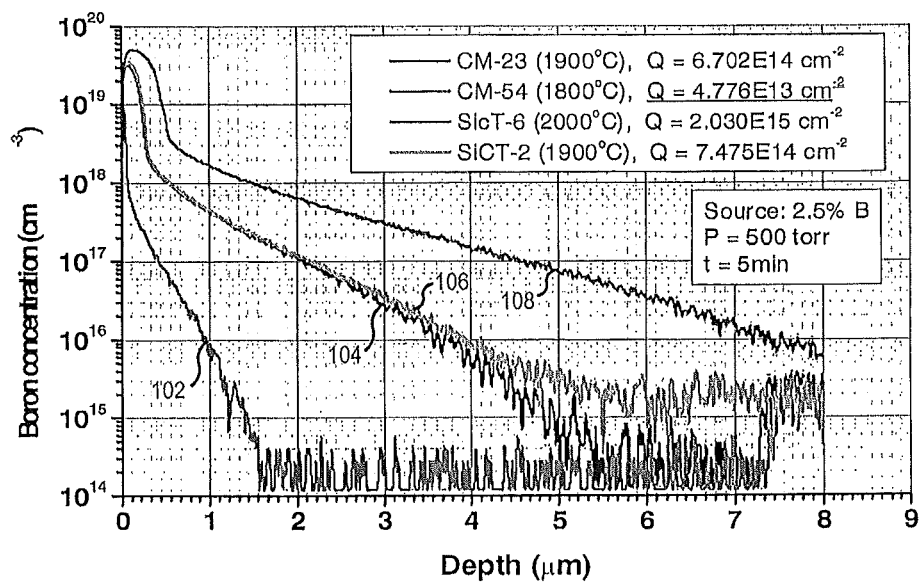

FIG. 4B illustrates several diffusion doping profiles of p-type dopants in 4H—SiC as measured by SIMS. Each curve represents a doping profile for a SiC layer diffusion doped with a gas phase source including 2.5% boron at a pressure of 500 torr for 5 minutes. The diffusion temperature was varied for each sample. Curve 102 represents a diffusion at 1800° C., while curves 104 and 106 represent diffusions at 1900° C., and curve 108 represents a diffusion at 2000° C. A significant drive-in diffusion was performed in an argon atmosphere at a temperature of 1800° C. for 5 minutes to redistribute the dopants. The total charge in the silicon carbide layer represented by curve 102 is $4.776 \times 10^{13}$ $cm^{-2}$. The total charge in the silicon carbide layer represented by curve 104 is $6.702 \times 10^{14}$ $cm^{-2}$, while the total charge in the silicon carbide layer represented by curve 106 is $7.475 \times 10^{14}$ $cm^{-2}$. Finally, the total charge in the silicon carbide layer represented by curve 108 is $2.030 \times 10^{15}$ $cm^{-2}$.

Figure 5:
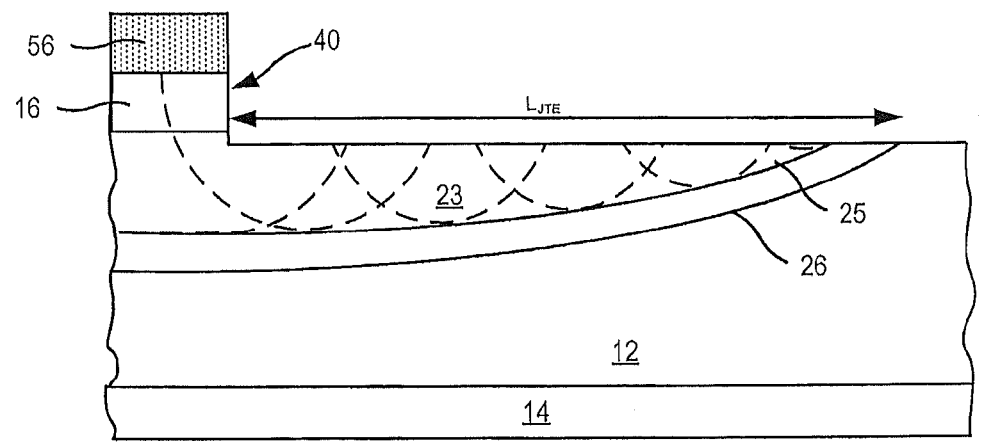
FIG. 5 illustrates formation of a JTE termination according to some embodiments.

In order to reduce or avoid a problem of less than full depletion at the design blocking voltage, a surface portion of the drift layer 12 may be removed, for example, by selective etching. Referring to FIG. 5, an etch mask 56, which may be photoresist, is formed on the drift layer 12 over the main junction of the device, and the highly doped surface portion of the drift layer 12 is selectively etched away. In some embodiments, about 0.2 μm of material may be etched from the surface of the drift layer 12. Selective etching may be performed, for example, using reactive ion etch techniques which are well known in the art.

A semiconductor mesa 40 is thereby formed to define the main junction of the device that includes the highly doped region 16, while a graded JTE region 23 with a much lower peak concentration of p-type dopants is defined, because the surface region of the drift layer 12 with a high concentration of p-type dopants has been removed. The mesa 40 may have a height of about 0.2 μm. The graded JTE region 23 may extend laterally from the mesa by a distance $L_{JTE}$. The surface doping concentration in the JTE region 23 may be greatest near the main junction of the device, and may decrease laterally outward from the junction.

In some embodiments, the JTE region 23 may have a maximum concentration of p-type dopants that permits the JTE region 23 to be fully depleted at the design blocking voltage. In particular embodiments, the JTE region 23 may have a maximum charge of p-type dopants that is about $1 \times 10^{14}$ $cm^{-2}$ or less, depending on how much of the drift layer is removed. In further embodiments, the JTE region 23 may have a maximum charge of p-type dopants that is about $2 \times 10^{13}$ $cm^{-2}$ or less, and in some embodiments about $1 \times 10^{13}$ $cm^{-2}$ or less. Furthermore, the charge of p-type dopants in the JTE region 23 may decrease laterally in a smooth fashion from the maximum charge near the main junction down to about $5 \times 10^{12}$ $cm^{-2}$ at a point distal from the main junction.

In some embodiments, the surface doping charge in the JTE region 23 may decrease from about $1 \times 10^{14}$ $cm^{-2}$ near the main junction down to about $1 \times 10^{13}$ $cm^{-2}$ at the outer edge of the JTE region 23.

In some embodiments, the surface doping concentration in the JTE region 23 may decrease from about $5\times10^{17}$ cm$^{-3}$ near the main junction down to about $10^{16}$ cm$^{-3}$ at the outer edge of the JTE region 23. In still further embodiments, the surface doping concentration in the JTE region 23 may decrease from about $10^{17}$ cm$^{-3}$ near the main junction down to about $10^{16}$ cm$^{-3}$ at the outer edge of the JTE region 23.

In some embodiments, the JTE region may have a total charge near the main junction of about $2\times10^{13}$ cm$^{-2}$, and in some embodiments, a total charge near the main junction of about $5\times10^{12}$ cm$^{-2}$.

Accordingly, a JTE region 23 that has a peak doping concentration that permits the JTE region 23 to be fully depleted at the design blocking voltage and that has a graded dopant profile that decreases in a relatively smooth fashion both laterally and vertically with distance from the main junction can be formed using only a single masking step, a single doping step and a single drive-in diffusion step.

Figure 6:
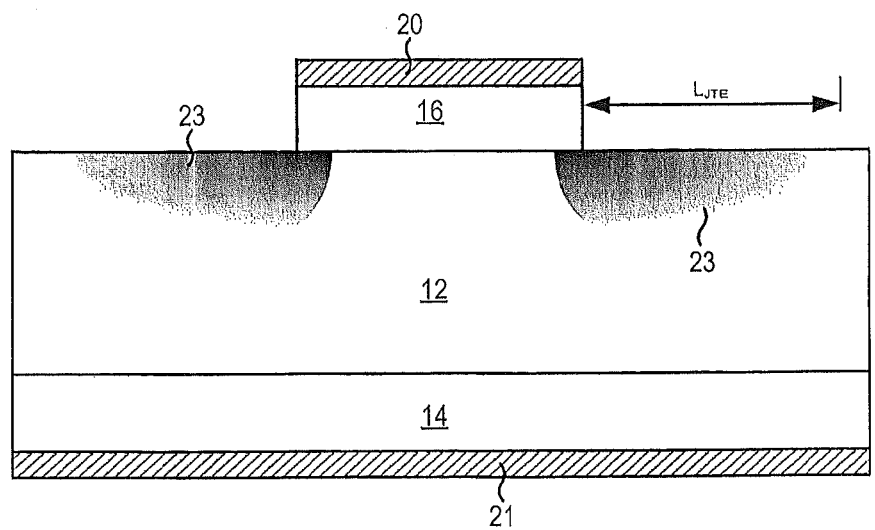
FIG. 6 illustrates a PIN diode according to some embodiments.

FIG. 6 illustrates a completed device including an anode contact 20 and a cathode contact 21 on the p-type region 16 and the substrate 14, respectively. The graded doping profile of the JTE region 23 in both lateral and vertical directions is indicated by shading in the device illustrated in FIG. 6.

As noted above, in order to provide a JTE region 23 that has a graded doping concentration in both the lateral and vertical directions, the amount of charge in the doped regions 20A-20E can be reduced with distance from the main junction. For both ion implantation and diffusion doping, the amount of charge that is doped into the drift layer 12 can be controlled by varying the size, shape, spacing and/or distribution of the doped regions 20A-20E. The size, shape, spacing and distribution of the doped regions 20A-20E is determined by the size, shape, spacing and/or distribution of the mask openings 54A-54E shown in FIG. 2A. Masks having various patterns of mask openings 54A-54E can be used. For example, the mask patterns 52A-52D shown in FIGS. 7A-7D include mask openings 54 (light areas) that expose progressively smaller areas of an underlying drift layer with distance from a main junction.

As illustrated in FIGS. 7A-7D, the mask openings 54 can be any geometric shape, such as linear, square, triangular, curvilinear, etc. In each case, the density and/or size of the mask openings can be reduced with distance from the main junction to expose smaller and smaller amounts of the drift layer 12. In this manner, the doped regions in the drift layer corresponding to the mask openings 54 will contain smaller and smaller amounts of total charge assuming that they are doped from the same implantation and/or gas phase source.

Figure 8:
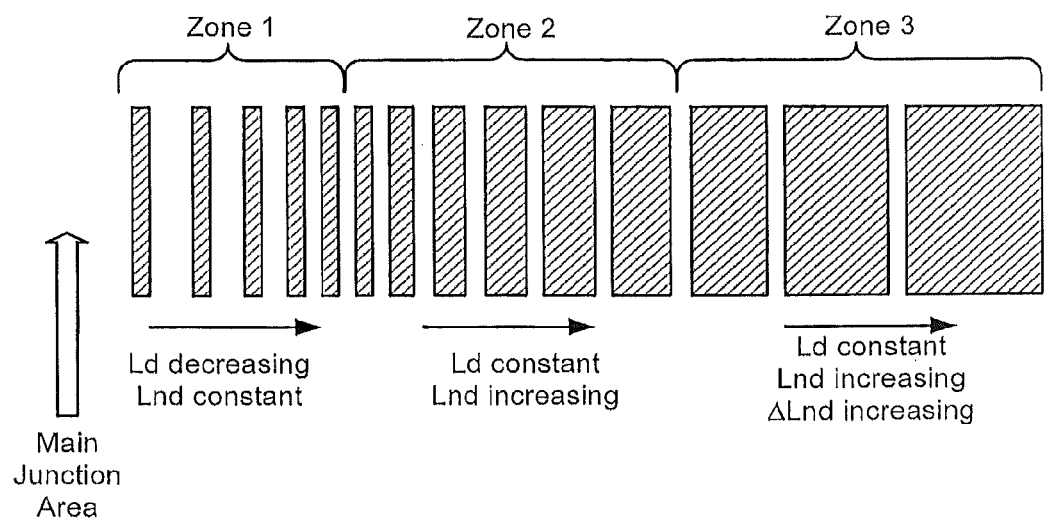
FIG. 8 illustrates mask design principles according to some embodiments.

Referring to FIG. 8, in some embodiments, the doping mask 52 can include generally linear mask openings 54. Each of the generally linear mask openings 54 may have a lateral width Ld, and may be spaced apart from an adjacent opening 54 by a width Lnd. In some embodiments, the doping mask 52 can be organized into a plurality of zones based on distance from the main junction area, illustrated in FIG. 8 as Zones 1 to 3. In a given zone, the lateral width Ld of the mask openings 54 may decrease with distance from the main junction and/or the lateral width Lnd between adjacent mask openings 54 may increase with distance from the main junction area.

For example, in the embodiments illustrated in FIG. 8, in Zone 1, which in FIG. 8 is closest to the main junction area, the lateral width Ld of the mask openings 54 decreases with distance from the main junction, while Lnd remains constant. In the next zone, Zone 2, the lateral width Lnd between adjacent mask openings 54 increases with distance from the main junction, while the lateral width Ld of the mask openings 54 remains constant. In Zone 3, the lateral width Lnd between adjacent mask openings 54 increases with distance from the main junction by an increasing amount with each step, while the lateral width Ld of the mask openings 54 remains constant and/or decreases.

In some particular embodiments, in Zone 1, the lateral width Ld of the mask openings 54 may start at 2.5 μm close to the junction, and may decrease in 0.05 μm steps down to 1 μm with increasing distance from the main junction, while the width Lnd between adjacent mask openings 54 may remain constant at 2 μm.

In Zone 2, the lateral width Ld of the mask openings 54 may remain constant at 1 μm, while the width Lnd between adjacent mask openings 54 may increase in 0.2 μm steps with increasing distance from the main junction.

In Zone 3, the lateral width Ld of the mask openings 54 may remain constant at 1 μm, while the lateral width Lnd between adjacent mask openings 54 increases with distance from the main junction by an amount ΔLnd that increases with each step. For example, in Zone 3, Lnd may increase in steps from 3.6 μm to 4.4 μm (ΔLnd=0.8 ξm), then from 4.4 μM to 5.4 μm (ΔLnd=1.0 μm), then from 5.4 μm to 6.6 μm (ΔLnd=1.2 μm), etc. It will be appreciated that although a general pattern as described above may be employed to provide decreasing levels of charge in the JTE region with distance from the main junction, there may be some deviations in the pattern while still achieving a generally linearly graded JTE region.

Figure 9:
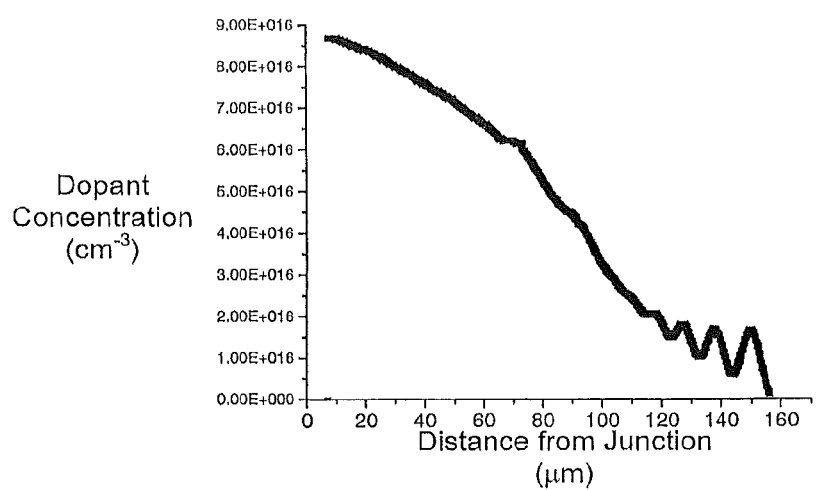
FIG. 9 illustrates a simulated quasi-linear doping profile that can be generated using a mask pattern according to some embodiments.

In particular embodiments, the mask 54 can be designed to provide a doping profile in the JTE region that decreases with distance from the junction in a linear, non-linear, or nearly linear fashion depending on the doping and/or annealing conditions. For example, a simulated doping profile that decreases in a quasi-linear fashion and that can be generated using a mask pattern as described above is illustrated in FIG. 9. The simulated doping profile shown in FIG. 9 is based on an anneal of a doped silicon carbide layer at 1800° C. for 30 minutes.

It will be appreciated that a junction termination extension as described above can be used in connection with many different kinds of unipolar and/or bipolar power devices, such as metal-oxide semiconductor field effect transistors (MOSFETs), insulated gate bipolar transistors (IGBTs), gate turn-off thyristors (GTOs), bipolar junction transistors (BJTs), MOS controlled thyristors (MCTs), PIN diodes, Schottky diodes, junction barrier Schottky (JBS) diodes, and others. Furthermore, a junction termination extension as described above can be used in connection with power devices fabricated using other semiconductor materials. For example, a junction termination extension as described herein could be used in connection with power devices fabricated using other wide bandgap semiconductor materials, such as gallium nitride based materials, or other semiconductor materials, such as silicon, germanium, gallium arsenide, etc.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:
1. An electronic device, comprising:
a silicon carbide layer having a first conductivity type and including a main junction adjacent a surface of the silicon carbide layer; and a junction termination region at the surface of the silicon carbide layer adjacent the main junction and having a second conductivity type that is opposite the first conductivity type, wherein a charge in the junction termination region decreases with lateral distance from the main junction, and wherein a maximum charge in the junction termination region is less than about $2 \times 10^{14}$ cm$^{-2}$, wherein the charge in the junction termination region decreases smoothly with lateral distance from the main junction;

wherein the junction termination region has a linearly graded doping profile that decreases in concentration laterally with distance from the main junction; and wherein a vertical depth of the junction termination region from a p-n junction between the junction termination region and an upper surface of the silicon carbide layer decreases with lateral distance from the main junction.

2. The electronic device of claim 1, wherein the junction termination region has a lateral width $L_{JTE}$.

3. The electronic device of claim 1, wherein a maximum charge in the junction termination region is less than about $1 \times 10^{14}$ cm$^{-2}$.

4. The electronic device of claim 1, wherein a maximum doping concentration in the junction termination region is about $5 \times 10^{18}$ cm$^{-3}$.

5. The electronic device of claim 1, wherein a charge in the junction termination region near a surface of the silicon carbide layer decreases laterally in a smooth fashion from the maximum charge near the main junction down to about $5 \times 10^{12}$ cm$^{-2}$.

6. The electronic device of claim 1, wherein the junction termination region is doped with aluminum and/or boron dopants.

7. The electronic device of claim 1, wherein the charge in the junction termination, region decreases smoothly with lateral distance from the main junction in a non-stepwise fashion without sharp changes.

8. The electronic device of claim 1, further comprising a semiconductor mesa at a surface of the silicon carbide layer, wherein, the junction termination region is adjacent the semiconductor mesa.

9. The electronic device of claim 8, wherein the semiconductor mesa has a height of about 0.2 μm.

10. The electronic device of claim 1, wherein the junction termination region comprises a plurality of laterally overlapping diffused regions in the silicon carbide layer.

11. The electronic device of claim 10, wherein adjacent ones of the laterally overlapping diffused regions have diffusion depths that decrease with lateral distance from the main junction.

12. An electronic device, comprising:

a silicon carbide layer having a first conductivity type and including a main junction adjacent a surface of the silicon carbide layer;

a junction termination region at the surface of the silicon carbide layer adjacent the main junction, the junction termination region comprising a region of second conductivity type dopants that has a total charge of about $5 \times 10^{12}$ cm$^{-2}$ or less in a region adjacent the primary junction, wherein the total charge in the junction termination region decreases with distance from the main junction in an approximately linear fashion, wherein the charge in the junction termination region decreases smoothly with lateral distance from the main junction;

wherein the junction termination region has a linearly graded doping profile that decreases in concentration laterally with distance from the main junction and wherein a vertical depth of the junction termination region from a p-n junction between the junction termination region and an upper surface of the silicon carbide layer decreases with lateral distance from the main junction.

13. The electronic device of claim 12, wherein the charge in the junction termination region decreases smoothly with lateral distance from the main junction in a non-stepwise fashion without sharp changes.

14. The electronic device of claim 12, wherein the junction termination region comprises a plurality of laterally overlapping diffused regions in the silicon carbide layer.

15. The electronic device of claim 14, wherein adjacent ones of the laterally overlapping diffused regions have diffusion depths that decrease with lateral distance from the main junction.

* * * * *

UNITED STATES PATENT AND TRADEMARK OFFICE
CERTIFICATE OF CORRECTION

PATENT NO. : 9,570,560 B2  
APPLICATION NO. : 14/102904  
DATED : February 14, 2017  
INVENTOR(S) : Zhang et al.

Page 1 of 1

It is certified that error appears in the above-identified patent and that said Letters Patent is hereby corrected as shown below:

In the Specification

Column 11, Line 3: Please correct "$cm^{-3}$ at the outer" to read -- $cm^{-3}$ at the outer --

Column 12, Line 21: Please correct "($\Delta Lnd=0.8\ \xi m$)" to read -- ($\Delta Lnd = 0.8\ \mu m$) --
  Line 22: Please correct "$4.4\mu M$ to" to read -- $4.4\mu m$ to --

In the Claims

Column 13, Claim 7, Line 37: Please correct "termination, region" to read -- termination region --
  Claim 8, Line 42: Please correct "wherein, the" to read -- wherein the --

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*